US011836426B1

(12) United States Patent
Du et al.

(10) Patent No.: US 11,836,426 B1
(45) Date of Patent: Dec. 5, 2023

(54) EARLY DETECTION OF SEQUENTIAL ACCESS VIOLATIONS FOR HIGH LEVEL SYNTHESIS

(71) Applicant: Xilinx, Inc., San Jose, CA (US)

(72) Inventors: Fangqing Du, San Jose, CA (US); Alexandre Isoard, San Jose, CA (US); Lin-Ya Yu, San Jose, CA (US); Hem C. Neema, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 17/819,884

(22) Filed: Aug. 15, 2022

(51) Int. Cl.
*G06F 30/327* (2020.01)
*G06F 15/80* (2006.01)

(52) U.S. Cl.
CPC .......... *G06F 30/327* (2020.01); *G06F 15/80* (2013.01)

(58) Field of Classification Search
CPC ................. G06F 30/327; G06F 15/80
See application file for complete search history.

(56) References Cited

U.S. PATENT DOCUMENTS

| | | |
|---|---|---|
| 9,081,930 B1 | 7/2015 | Neuendorffer et al. |
| 9,449,131 B2 | 9/2016 | Han et al. |
| 9,710,584 B1 | 7/2017 | Hao et al. |
| 9,824,172 B1 | 11/2017 | Tao et al. |
| 10,013,517 B1 | 7/2018 | Zhou et al. |
| 10,031,732 B1 | 7/2018 | Li et al. |
| 10,108,769 B1 | 10/2018 | Li et al. |
| 10,586,003 B1 | 3/2020 | Suresh |
| 10,671,779 B1 | 6/2020 | Neuendorffer |
| 11,238,199 B1 | 2/2022 | Isoard et al. |
| 2005/0268271 A1* | 12/2005 | Gutberlet ............... G06F 30/327 716/102 |
| 2007/0234267 A1* | 10/2007 | Kakui .................... G06F 30/327 716/104 |
| 2008/0148215 A1* | 6/2008 | Gutberlet ................ G06F 8/443 716/132 |
| 2013/0305198 A1* | 11/2013 | Yamamoto ............ G06F 30/327 716/104 |

* cited by examiner

*Primary Examiner* — Stacy Whitmore
(74) *Attorney, Agent, or Firm* — Kevin T. Cuenot

(57) ABSTRACT

Detecting sequential access violations for high-level synthesis (HLS) includes performing a simulation, using computer hardware, of an application for HLS. During the simulation, accesses of the application to elements of an array of the application are detected. During the simulation, determinations of whether the accesses occur in a sequential order are made. An indication of whether the access occur in sequential order is generated.

18 Claims, 9 Drawing Sheets

```
1   template <typename T>
2   constexpr std::size_t DimProduct() {
3      if (!std::is_array<T>::value) return 1;
4      return std::extent<T>::value *
5          DimProduct<typename std::remove_extent<T>::type>();
6   }
7
8   template <typename T>
9   void printDim() {
10     std::cout << std::extent<T>::value;
11     if (std::is_array<typename std::remove_extent<T>::type>::value) {
12        std::cout << ", ";
13        printDim<typename std::remove_extent<T>::type>();
14     }
15  }
16
17  #ifndef __SYNTHESIS__
18  struct Array2StreamInfo {
19     Array2StreamInfo() : ReadNo(std::size_t(-1)), WriteNo(std::size_t(-1)) {}
20     std::size_t ReadNo;
21     std::size_t WriteNo;
22  };
23
24  std::map<void *, Array2StreamInfo> Array2StreamMap;
25  #endif
26
27  template <typename T>
28  struct array_to_stream {
29     T arr;
30  #ifndef __SYNTHESIS__
31     array_to_stream() {
32        static_assert(std::is_array<T>::value,
33              "array_to_stream template type is not an array type?!");
34        std::cout << "constructing array-to-stream object with "
35              << std::rank<T>::value << " dimensions" << std::endl;
36        std::cout << "array-to-stream object dim product is " << DimProduct<T>()
37              << std::endl;
38        std::cout << "Each dim size: ";
39        printDim<T>();
40        std::cout << std::endl;
41
42        Array2StreamInfo Info;
43        Array2StreamMap[this] = Info;
44     }
45     array_to_stream(const array_to_stream<T> &) = delete;
46     ~array_to_stream() {
47        assert(Array2StreamMap.count(this) == 1);
48        Array2StreamMap.erase(this);
49     }
50  #endif
```

FIG. 1A

```
51      template <typename T2, typename NextT>
52      struct Ele {
53          NextT *SubArr;
54  #ifndef __SYNTHESIS__
55          array_to_stream<T2> *Arr;
56          std::size_t DimLevel;
57          std::size_t TotalIndex;
58          bool AccessElem;
59  #endif
60          using EleTy = typename std::remove_all_extents<T2>::type;
61  #ifndef __SYNTHESIS__
62          Ele(array_to_stream<T2> *Arr, std::size_t idx)
63              : Arr(Arr), DimLevel(0), AccessElem(false) {
64              SubArr = &(Arr->arr[idx]);
65              TotalIndex = idx * DimProduct<NextT>();
66              // std::cout << "Total index is " << TotalIndex;
67              if (!std::is_array<NextT>::value) {
68                  AccessElem = true;
69              }
70          }
71  #else
72          Inline Ele(array_to_stream<T2> *Arr, std::size_t idx){
73              SubArr = &(Arr->arr[idx]);
74          }
75  #endif
76  #ifndef __SYNTHESIS__
77          template <typename NextT2>
78          Ele(Ele<T2, NextT2> &E, std::size_t idx)
79              : Arr(E.Arr),
80                DimLevel(E.DimLevel + 1),
81                TotalIndex(0),
82                AccessElem(false) {
83              SubArr = &((*E.SubArr)[idx]);
84              auto &Info = Array2StreamMap[Arr];
85              TotalIndex = idx * DimProduct<NextT>();
86              TotalIndex += E.TotalIndex;
87              if (!std::is_array<NextT>::value) {
88                  AccessElem = true;
89                  // std::cout << ", " << TotalIndex<< std::endl;
90              } else {
91                  // std::cout << ", " << TotalIndex ;
92              }
93          }
94
95  #else
96          template <typename NextT2>
97          Inline Ele(Ele<T2, NextT2> &E, std::size_t idx) {
98              SubArr = &((*E.SubArr)[idx]);
99          }
100 #endif
```

FIG. 1B

```
101  #ifndef __SYNTHESIS__
102      Ele<T2, typename std::remove_extent<NextT>::type> operator[](
103        std::size_t idx) {
104        auto &Info = Array2StreamMap[Arr];
105        if (!std::is_array<NextT>::value) {
106          std::cerr << "current dim level is " << DimLevel
107                  << ", limit dim level is " << std::rank<T2>::value
108                  << std::endl;
109          std::cerr << "Scalar cannot have '[]' operator." << std::endl;
110          exit(1);
111        }
112        return Ele<T2, typename std::remove_extent<NextT>::type>(*this,
113                                          idx);
114      }
115  #else
116      Inline Ele<T2, typename std::remove_extent<NextT>::type> operator[](
117        std::size_t idx) {
118        return Ele<T2, typename std::remove_extent<NextT>::type>(*this,
119                                          idx);
120      }
121  #endif
122  #ifndef __SYNTHESIS__
123      operator EleTy() {
124        auto &Info = Array2StreamMap[Arr];
125        std::cout << "Read access Index: " << TotalIndex << std::endl;
126        if (Info.ReadNo + 1 != TotalIndex) {
127          std::cerr << "Not read in sequential, expected read NO. is "
128                  << Info.ReadNo + 1 << std::endl;
129          exit(1);
130        }
131        Info.ReadNo++;
132        return *SubArr;
133      }
134  #else
135      Inline operator EleTy() {
136        EleTy tmp;
137        __fpga_fifo_pop(((EleTy*)SubArr), &tmp);
138        return tmp;
139      }
140  #endif
141
142  #ifndef __SYNTHESIS__
143      void operator=(const EleTy &In) {
144        auto &Info = Array2StreamMap[Arr];
145        std::cout << "Write access Index2: " << TotalIndex << std::endl;
146        if (Info.WriteNo + 1 != TotalIndex) {
147          std::cerr << "Not write in sequential, expected write NO. is "
148                  << Info.WriteNo + 1 << std::endl;
149          exit(1);
150        }
```

FIG. 1C

```
151            Info.WriteNo++;
152            *SubArr = In;
153            //return *this;
154         }
155  #else
156         Inline void operator=(const EleTy &In) {
157            __fpga_fifo_push(((EleTy*)SubArr), &In);
158         }
159  #endif
160      };
161      Inline Ele<T, typename std::remove_extent<T>::type> operator[](int idx) {
162         return Ele<T, typename std::remove_extent<T>::type>(this, idx);
163      }
164  #ifndef __SYNTHESIS__
165      void clear() {
166         auto &Info = Array2StreamMap[this];
167
168         // which will not clear the array, but just reset the read/write pointer
169         Info.ReadNo = Info.WriteNo = std::size_t(-1);
170      }
171  #endif
172   };
```

1      struct A {
2        int foo;
3        int bar;
4      };
5
6      void write(array_to_stream<A[3][4]> &arr2stream) {
7        int count = 0;
8        for (unsigned i = 0; i < 3; i++)
9          for (unsigned j = 0; j < 4; j++) {
10           A tmp{count++, count++};
11           arr2stream[i][j] = tmp;
12         }
13     }
14
15     void read(array_to_stream<A[3][4]> &arr2stream) {
16       for (unsigned i = 0; i < 3; i++)
17         for (unsigned j = 0; j < 4; j++) {
18           A tmp = arr2stream[i][j];
19           //std::cout << tmp.foo << ", " << tmp.bar << "\n";
20         }
21     }
22
23     int main() {
24       array_to_stream<A[3][4]> arr2stream;
25
26       std::cout << "size of 'array_to_stream<A[3][4]>' is "
27              << sizeof(arr2stream) << std::endl;
28
29       write(arr2stream);
30       read(arr2stream);
31       arr2stream.clear();
32       //arr2stream[0][1] = A{4, 5};
33       return 0;
34     }
```

FIG. 3

```
INFO: [SIM 211-2] *************** CSIM start ***************
INFO: [SIM 211-4] CSIM will launch GCC as the compiler.
         Compiling ../../../../test.cpp in debug mode
         Generating csim.exe
constructing array-to-stream object with 2 dimensions
array-to-stream object dim product is 12
Each dim size: 3, 4
size of 'array_to_stream<A[3][4]>' is 96
Write access Index2: 0
Write access Index2: 1
Write access Index2: 2
Write access Index2: 3
Write access Index2: 4
Write access Index2: 5
Write access Index2: 6
Write access Index2: 7
Write access Index2: 8
Write access Index2: 9
Write access Index2: 10
Write access Index2: 11
Read access Index: 0
Read access Index: 1
Read access Index: 2
Read access Index: 3
Read access Index: 4
Read access Index: 5
Read access Index: 6
Read access Index: 7
Read access Index: 8
Read access Index: 9
Read access Index: 10
Read access Index: 11
INFO: [SIM 211-1] CSim done with 0 errors.
INFO: [SIM 211-3] *************** CSIM finish ***************
```

FIG. 4

INFO: [SIM 211-2] ************* CSIM start *************
INFO: [SIM 211-4] CSIM will launch GCC as the compiler.
        Compiling ../../../../test.cpp in debug mode
        Generating csim.exe
constructing array-to-stream object with 2 dimensions
array-to-stream object dim product is 12
Each dim size: 3, 4
size of 'array_to_stream<A[3][4]>' is 96
Write access Index2: 0
Write access Index2: 1
Write access Index2: 2
Write access Index2: 3
Write access Index2: 4
Write access Index2: 5
Write access Index2: 6
Write access Index2: 7
Write access Index2: 8
Write access Index2: 9
Write access Index2: 10
Write access Index2: 11
Read access Index: 0
Read access Index: 1
Read access Index: 2
Read access Index: 3
Read access Index: 4
Read access Index: 5
Read access Index: 6
Read access Index: 7
Read access Index: 8
Read access Index: 9
Read access Index: 10
Read access Index: 11
Write access Index2: 1
Not write in sequential, expected write NO. is 0
@E Simulation failed: Function 'main' returns nonzero value '1'.
ERROR: [SIM 211-100] 'csim_design' failed: nonzero return value.
INFO: [SIM 211-3] ************* CSIM finish *************

FIG. 5

EARLY DETECTION OF SEQUENTIAL ACCESS VIOLATIONS FOR HIGH LEVEL SYNTHESIS

RESERVATION OF RIGHTS IN COPYRIGHTED MATERIAL

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

TECHNICAL FIELD

This disclosure relates to high-level synthesis (HLS) and, more particularly, to early detection of sequential access violations in applications for HLS.

BACKGROUND

High-level synthesis or "HLS" refers to an automated, computer-based design process in which a description of desired behavior of an electronic system is converted into a circuit design. The circuit design ultimately may be realized in physical circuitry. The description of the desired behavior is typically written as an application in a high-level programming language such as C, C++, or the like. The application undergoes HLS where the application is translated into a circuit design. The circuit design is specified as a register transfer logic (RTL) description using a hardware description language. The RTL description describes a synchronous digital circuit in terms of the flow of digital signals between hardware registers and the operations performed on those signals. The circuit design, e.g., the RTL description, may be processed through a design flow including synthesis (e.g., netlist generation), placement, and routing. The circuit design, as processed through the design flow, may be implemented within an integrated circuit.

Within the application, data movements that are to be implemented in hardware as stream channels may be specified as arrays. A stream channel, as implemented in hardware, refers to a point-to-point data connection that does not require address decoding. Stream channels save hardware resources since the stream size, in reference to the depth of the resulting data path as realized in circuitry, correlates with the gap between the write pointer and read pointer.

To successfully implement a stream channel in hardware from an application using HLS, arrays of the application must be accessed in sequential order. That is, both read and write accesses of array elements of the application must occur in sequential order rather than in some other, possibly arbitrary, order. An order of access of the array other than sequential results in an incorrect RTL description.

HLS workflows often support high-level simulation of the application and conversion of the application into an RTL description. High-level simulation of the application may be performed prior to the conversion so that certain functional aspects of the application, as written in the high-level programming language, may be verified. When performing high-level simulation of the application, the order in which elements of arrays are accessed is not tracked. That is, in performing a C/C++ simulation of the application, the simulation will be successful regardless of whether the elements in the array(s) are accessed in sequentially. Such is the case as C/C++ supports arbitrary access to array elements.

In cases where array(s) of an application are not accessed in sequential order, such sequential access violations may not be found until much later in the development process. Detecting sequential access violations during synthesis (e.g., netlist generation) is often very difficult. In the usual case, array access violations are detected only after the application has been translated into RTL and RTL simulation has been performed. That is, the sequential access violation is detected since the RTL description is incorrect. Detecting errors this late in the development process consumes significant time for debugging and redesign.

SUMMARY

In one or more example implementations, a method includes performing a simulation, using computer hardware, of an application for High-Level Synthesis (HLS). The method includes, during the simulation, detecting accesses of the application to elements of an array of the application. The method includes, during the simulation, determining whether the accesses occur in sequential order. The method includes generating an indication of whether the accesses occur in sequential order.

In one or more example implementations, a system includes one or more processors configured to initiate operations. The operations include performing a simulation of an application for HLS. The operations include, during the simulation, detecting accesses of the application to elements of an array of the application. The operations include, during the simulation, determining whether the accesses occur in sequential order. The operations include generating an indication of whether the accesses occur in sequential order.

In one or more example implementations, a computer program product includes one or more computer-readable storage media, and program instructions collectively stored on the one or more computer-readable storage media. The program instructions are executable by a hardware processor to initiate operations. The operations include performing a simulation of an application for HLS. The operations include, during the simulation, detecting accesses of the application to elements of an array of the application. The operations include, during the simulation, determining whether the accesses occur in sequential order. The operations include generating an indication of whether the accesses occur in sequential order.

This Summary section is provided merely to introduce certain concepts and not to identify any key or essential features of the claimed subject matter. Other features of the inventive arrangements will be apparent from the accompanying drawings and from the following detailed description.

BRIEF DESCRIPTION OF THE DRAWINGS

The inventive arrangements are illustrated by way of example in the accompanying drawings. The drawings, however, should not be construed to be limiting of the inventive arrangements to only the particular implementations shown. Various aspects and advantages will become apparent upon review of the following detailed description and upon reference to the drawings.

FIGS. 1A, 1B, 1C, and 1D, taken collectively, illustrate an example of library code that may be incorporated into an application for High-Level Synthesis (HLS) for detecting sequential access violations.

FIG. 3 illustrates an example of an application for HLS for use with the library code of FIG. 2.

FIG. 4 illustrates an example of output generated by simulation of an application for HLS in which the accesses do occur in sequential, increasing order.

FIG. 5 illustrates an example of output generated by simulation of an application for HLS in which accesses do not occur in sequential, increasing order.

DETAILED DESCRIPTION

Figure 2:
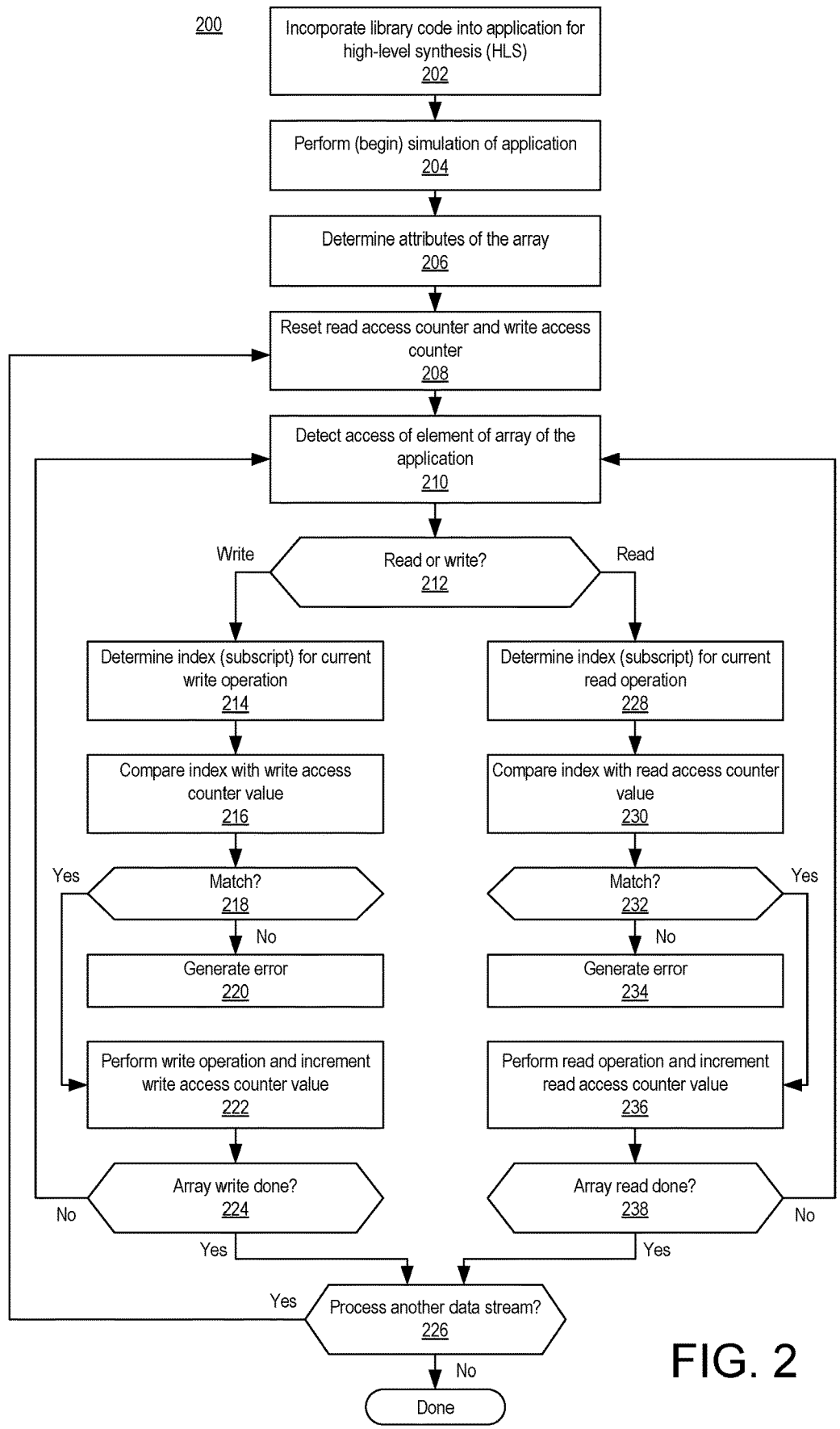
FIG. 2 illustrates an example method of detecting sequential access violations by an application for HLS.

This disclosure relates to high-level synthesis (HLS) and, more particularly, to early detection of sequential access violations in applications for HLS. Within an application for HLS, data movements to be implemented in hardware as stream channels may be specified as arrays. The access of an array signifies implementation of a stream channel in the hardware implementation of the application. A stream channels links two (or more) modules (e.g., circuits or systems), where a source module (circuit or system) writes to one end of the stream channel (e.g., a first-in-first-out or "FIFO" memory) and a destination module (circuit or system) reads from the other end of the stream channel so long as the stream channel is written and read in a sequential order.

To correctly specify the stream channel, the writes must be specified in an increasing sequential order and the reads also must be specified in an increasing sequential order. Alternatively, the writes must be specified in a decreasing sequential order and the reads also must be specified in a decreasing sequential order. Thus, both the writes and the reads must occur in the same (decreasing or increasing) sequential order. As defined herein, the term "sequential order" means that the array is accessed in either an increasing sequential order or a decreasing sequential order for both reads and writes. The various examples within this disclosure utilize increasing sequential order. It should be appreciated that in other embodiments, the accesses may occur and be checked for decreasing sequential order.

In accordance with the inventive arrangements described within this disclosure, an application for HLS, as specified in a high-level programming language, may be simulated. During the simulation, any accesses to arrays may be checked to ensure that such accesses occur in a sequential order. That is, the N elements of the array are accessed in order from 0, 1, 2, . . . N-1 (e.g., increasing sequential order) or are accessed in order from N-1, . . . , 2, 1, 0 (e.g., decreasing sequential order). Within this disclosure, the term "access," with respect to an array, means a read and/or a write.

In one or more example implementations, the various functions and operations described may be implemented as library code. The library code may be incorporated into an application for HLS. FIGS. 1A, 1B, 1C, and 1D, taken collectively, illustrate an example of library code that may be incorporated into an application for HLS. For purposes of discussion, FIGS. 1A, 1B, 1C, and 1D may be collectively referred to as FIG. 1.

The example library code of FIG. 1 is also referred to as the array_to_stream library. In one or more example implementations, the library code may be specified as a header file that a user may include within an application for HLS. The library code provides Application Programming Interfaces (APIs) for performing accesses of arrays. The library code also supports checking that any accesses to an array, during simulation, are sequential. Observance of this restriction allows the resulting circuit design generated from the application by an HLS flow to be implemented in hardware (e.g., an integrated circuit) with the array being physically realized in the circuitry as a stream channel.

In general, the library code of FIG. 1 includes two parts. One part specifies instructions for use with a high-level programming language simulation model. The high-level programming language simulation model may include compiling the application into executable program code and executing the compiled application. Another part of the library code of FIG. 1 specifies instructions for an HLS flow. The _SYNTHESIS_ macro within the example library code of FIG. 1 may be used to control whether any simulation-related instructions (e.g., the instructions of the simulation model) included in the library code are executed. Though the _SYNTHESIS_ macro is used throughout FIG. 1, for purposes of illustration, particular examples of the _SYNTHESIS_ macro are found at lines 17 and 30 of FIG. 1A. For example, if SYNTHESIS is set to false, the simulation instructions beneath the _SYNTHESIS_ macro up to the #endif instruction are executed. If SYNTHESIS is set to true, the simulation instructions beneath the _SYNTHESIS_ macro to the #endif instruction are not executed. As a more specific example, if SYNTHESIS is set to true, the instructions of lines 18-24 are not executed.

In the example of FIG. 1A, at lines 27-29, the library code defines an array_to_stream template class and a template parameter that accepts a C++ array type. To have a same data-layout as the C/C++ built-in array, the library code defines only one class field arr with template parameter type T. This construction makes post-synthesis co-simulation function verification easier. That is, using the same data layout as the built-in array structure of C/C++ makes data transfers between a host system and the kernel easier to implement.

At lines 18-25, 31, and 42-43 of FIG. 1A, the library code defines a global map called Array2StreamMap. The global map is used during simulation to check the order in which elements of arrays are accessed during the simulation. The global map is used to check the sequential access of elements of arrays. In one aspect, the global map stores each data stream and the access information for the data stream. The access information stored in the global map for each data stream can include, but is not limited to, a read access counter and a write access counter. The read access counter, ReadNo, stores the index of a current read of an element of an array. The write access counter, WriteNo, stores the index of a current write of an element of the array. After each access of an element of the array, the corresponding counter is incremented by one. Before a next access of an element of the array, the respective counter is used to check or determine whether the next access to an element of the array is in sequence. In one example implementation, the constructor of array_to_stream initializes each of the read access counter and the write access counter to "−1." A value of −1 indicates that the read/write access counter has not yet been incremented (e.g., that a read/write has not yet been detected).

At lines 51-52 of FIG. 1B, the library code defines a sub-class called Ele. The sub-class Ele is defined in the class array_to_stream. For the synthesis model, the sub-class Ele contains only the field SubArr. For the simulation model, the sub-class Ele contains two additional fields Arr and Total- Index at lines 55-57. The fields Arr and TotalIndex are used to check that elements of an array are accessed in sequential order.

In the example of FIG. 1, to keep the built-in array semantics, a bracket [] operator is provided. In using C/C++, the built-in array semantics such as the bracket operator (e.g., arr[i]) are utilized and maintained. The library code keeps the semantic in place for array accesses so that users do not need to change their coding style to utilize the functionality of the library code. Referring to lines 161-163 of FIG. 1D, the bracket operator [] returns the Ele object. At lines 62-100 of FIG. 1B, the library code provides two constructors. One constructor is from the original array_to_stream object. The other constructor is from the parent Ele class object. For the simulation model, to check the sequential accesses, the library code records the subscript of the element of the array being accessed in TotalIndex. The subscript of the element refers to the one-dimensional index of the current element of the array being accessed as transformed from the multi-dimensional array indices. For the synthesis model, the library code returns the underlying object arr subscript.

In the case of a multi-dimensional array, there may be two or more bracket operators. For example, one bracket operator is used for each dimension of the array. An example of this is provided below in the application illustrated in FIG. 3. To support multi-dimensional arrays, at lines 116-119 of FIG. 1C the library code provides a bracket operator for the Ele object.

Referring to lines 143-150 of FIG. 1C, the library code also provides an assignment operator=. The assignment operator also keeps the built-in or native array semantics of C/C++. The assignment operator is a write operation. In the simulation model, the library code determines whether the currently accessed accumulated subscript is in sequential order by comparing the currently accessed accumulated subscript with the value of WriteNo or a value derived from WriteNo (e.g., WriteNo+1). If the comparison indicates a mismatch, the library code dumps the violation error and provides a notification of the expected access number. In the synthesis model, a first-in-first-out (FIFO) push intrinsic is included at line 157 of FIG. 1D that the HLS flow can identify.

To maintain the built-in array usage habit of C/C++, the library code provides implicit type conversion from the Ele object to the element type of the array when read from the array_to_stream object. In the simulation model, the library code at lines 123-129 of FIG. 1C checks that the currently accessed accumulated subscript is in sequential order through comparison with ReadNo or a value derived from ReadNo (e.g., ReadNo+1). If not, the library code dumps the violation error and provides a notification of the expected access number. In the synthesis model, at line 137 of FIG. 1C, the library code defines a FIFO pop intrinsic that the HLS flow can identify.

FIG. 2 illustrates an example method 200 of detecting sequential access violations by an application for HLS. Method 200 may be performed by an Electronic Design Automation (EDA) system. An EDA system is implemented with a data processing system executing suitable operational software or program instructions to perform the operations described within this disclosure. An example of a data processing system that may be used to implement an EDA system is described in connection with FIG. 6.

In accordance with the inventive arrangements described within this disclosure, the EDA system is capable of performing HLS. The EDA system, as part of performing HLS, is capable of performing high-level programming language simulation. High-level programming language simulation may include C and/or C++ simulation of an application intended for HLS. The EDA system, as part of performing HLS, is also capable of performing an HLS flow. An HLS flow refers to translating the application, as specified in a high-level programming language, into an RTL description.

In block 202, library code may be incorporated, e.g., included, into an application for HLS. FIG. 3 illustrates an example of an application 300 for HLS in which the example library code of FIG. 2 can be incorporated. As illustrated, application 300 includes a read function for reading an array and a write function for writing an array. Each of the functions utilizes the library code to effectuate the reads and/or writes as the case may be.

In block 204, the EDA system can perform simulation of the application. For example, the EDA system is capable of compiling the application into an executable. The EDA system may execute the executable to perform simulation of the application (e.g., high-level simulation as distinguished from simulating an RTL description of the application). It should be appreciated that subsequent to block 204, the remaining blocks of FIG. 2 are performed during simulation. Further, the operations may be performed by the EDA system prior to RTL translation and, as such, prior to RTL simulation.

In block 206, the EDA system determines attributes of the array. For example, referring to the example of FIG. 3, the array being accessed is defined as having two dimensions [3][4]. In this example, the array has 3 rows and 4 columns. The EDA system determines the number of dimensions of the array_to_stream object, the number of elements of the array_to_stream object, the dimension size, and the overall size in bytes of the array_to_stream object. Example 1 below illustrates sample output that may be generated by the EDA system in simulating application 300 using the example library code of FIG. 2. The output of Example 1 may be generated via lines 31-41 of FIG. 1A. The last line of the example output is generated by lines 26-27 of application 300.

Example 1 constructing array-to-stream object with 2 dimensions
array-to-stream object dim product is 12
Each dim size: 3, 4
size of 'array_to_stream<A[3][4]>' is 96

In block 208, the EDA system resets the read access counter (ReadNo) and the write access counter (WriteNo). For example, at line 19 of FIG. 1A, the constructor of array_to_stream initializes each of the read access counter and the write access counter to "−1." A value of −1 indicates that the read/write access counter has not yet been incremented (e.g., that a read/write has not yet been detected).

In block 210, during the simulation, the EDA system detects accesses of the application to elements of an array of the application. That is, the EDA system detects that the application, during simulation, is accessing an element of an array of the application. Referring to the example of FIG. 3, the application utilizes the example library code to effectuate read and writes of the array. The library code performs the tracking and comparisons necessary to detect sequential access violations.

In block 212, the EDA system determines whether the access is a read or a write. In response to determining that the access is a write, method 200 continues to block 214. In response to determining that the access is a read, method 200 continues to block 228. For example, referring to FIG. 3, the application invokes the write function at line 29 or the read function at line 30.

As noted, the examples described herein check for a sequential increasing order. In the examples describe herein, the application for HLS is intended to utilize increasing sequential accesses. In other example implementations, a decreasing sequential order may be checked if the particular application accesses are coded using decreasing sequential order. In one or more other examples, accesses to elements of a given array implementing a data stream (e.g., a stream channel) may be checked on a case-by-case basis for increasing or decreasing sequential order as the case may be.

As discussed, both read and write accesses of the array must operate in the same direction (increasing or decreasing). In addition, the techniques described herein do not require that all writes be performed first followed by all reads. In one or more example implementations, the application for HLS may perform a plurality of reads, followed by a plurality of writes, in an iterative manner. The inventive arrangements will detect cases where accesses are not performed in sequential order (e.g., a sequential access violation) whether all writes are performed prior to all reads or the writes and reads are interspersed (occur groups of one or more in alternating fashion).

In blocks 214, 216, and 218, during the simulation, the EDA system determines whether each of the accesses (e.g., writes) occurs in a sequential order. For example, the EDA system maintains the write access counter that is incremented in response to each write access to an element of the array that is detected, compares the write access counter with an index of the element of the array being written, and detects whether the write accesses are sequential based on the comparing.

At block 214, the EDA system determines the index (e.g., the subscript) of the current write operation. As noted, the subscript of the element refers to the one-dimensional index for the array element as transformed from the multi-dimensional array indices. In block 214, the EDA system converts the multidimensional indices of the array element being accessed into a single dimension index (e.g., the subscript). In doing so, the EDA system invokes the bracket [] operator.

For example, at line 11 of FIG. 3, the application accesses element [i][j] of the array. The first invocation of the bracket operator for index i at line 11 of FIG. 3 invokes lines 161-162 of FIG. 1D, which record the current register-to-stream object and the first dimension index within the Ele object. The Ele object is returned. The constructor used to process the first dimension index is specified at line 70 of FIG. 1B. The first invocation of the bracket operator constructs the Ele object and removes the first dimension index of the array. In the case of a two-dimensional array, this selects a row of the array specified by the current value of index i. The result is effectively a sub-array. Line 81 of FIG. 1B refers to a member of the array (E.Arr) where Arr refers to the register-to-stream object.

The second bracket operator corresponding to the index j at line 11 of FIG. 3 operates on the Ele object (e.g., in this case the selected row of the array) and not as part of main. In this example, since the array is a two-dimensional array and having removed the first dimension index, only one dimension remains. Next the second dimension index is stripped off and the element object is returned again. The element object is constructed from a second and different constructor specified at line 84 of FIG. 1B.

In lines 85-91 of FIG. 1C, the EDA system checks that the final element is the last dimension of the array and that all preceding dimensions have been stripped or removed. For example, presuming that the current values of [i][j] are 1, 1, the current array element is determined to have an index of 5 (starting from 0). That is, array element 1,1, in a two-dimensional array, is the $5^{th}$ element of the array. Table 1 illustrates the multi-dimensional index to single-dimension index (e.g., subscript) mapping to the $5^{th}$ element of the array.

TABLE 1

| Element | Multidimensional Indices |
|---------|--------------------------|
| 0 | 0, 0 |
| 1 | 0, 1 |
| 2 | 0, 2 |
| 3 | 0, 3 |
| 4 | 1, 0 |
| 5 | 1, 1 |

Peeling the indices in the manner described, in general, and in the case of a two-dimensional array, may be achieved by multiplying the first dimensional index value i by the number of elements in the row (4) and adding the number of elements specified by the second dimensional index value j. In this example, the first dimensional value is 1, the number of elements in the row is 4, and the second dimensional value is 1. Thus, the subscript for the array element 1, 1 may be calculated as the (1×4)+1. TotalIndex stores the index of the element of the current write operation (e.g., the subscript). The EDA system determines the index of the element of the array currently being written (e.g., accessed) based on a current state of each dimension of the array.

In block 216, the EDA system compares the index as stored in TotalIndex with the write access counter value. In the particular example implementation of FIG. 1, the write access counter value is incremented subsequent to the write operation. Accordingly, for purposes of comparison with the index, the value stored in TotalIndex is compared with the write access counter value+1. Recalling that the write access counter is initialized to −1, for the first write operation of the array in which element 0 is accessed, the write access counter value+1 (e.g., 0) is compared with the index.

In block 218, the EDA system determines whether a match has been determined. That is, the EDA system determines whether the index stored in TotalIndex matches, or is equal to, the write access counter value+1. Lines 143-149 of FIG. 1C illustrate the comparison that is performed with line 146, in particular, specifying the condition to be met. In response to determining that a match has been detected, method 200 continues to block 222. In block 222, the EDA system performs the write operation and increments the write access counter value. Block 222 may correspond to lines 151-152 of FIG. 1D. In detecting a match in block 218, the EDA system determines that the array access for the current element is sequential (e.g., sequential, increasing). The value of the current access also may be output. In response to detecting a mismatch in block 218, the EDA system generates an error and discontinues simulation of the application for HLS. For example, an error may be output in line 147 of FIG. 1C.

For example, the EDA system is capable of generating an indication of whether the accesses occur in sequential, increasing order. Examples of the EDA system providing an indication of whether the accesses occur in sequential order are illustrated in FIGS. 4 and 5. FIG. 4 illustrates an example in which the accesses do occur in sequential order. FIG. 5 illustrates an example in which accesses do not occur in sequential order.

Continuing with block 224, the EDA system determines whether the application has completed writing elements of the array. In response to determining that the application has completed writing elements of the array, method 200 continues to block 226. In response to determining that the application has not completed writing elements of the array, method 200 loops back to block 210 to continue writing further elements of the array.

In block 226, the EDA system determines whether a further data stream is to be processed as part of simulating the application for HLS. In response to determining that another data stream is to be processed, method 200 loops back to block 208 to continue processing. In response to determining that no further data streams are to be processed, method 200 may end.

Referring to read operations, in blocks 228, 230, and 232, during the simulation, the EDA system determines whether each of the accesses (e.g., reads) occurs in a sequential order (e.g., a sequential, increasing order). For example, the EDA system maintains a read access counter that is incremented in response to each read access to an element of the array that is detected, compares the read access counter with an index of the element of the array being read, and detects whether the read accesses are sequential based on the comparing. The EDA system is capable of determining the index of the element of the array being read based on a current state of each dimension of the array.

Referring to block 228, the EDA system determines the index (e.g., subscript) of the current read operation. The EDA system may perform the operations described in connection with block 214 to translate the element of the array currently being accessed from multidimensional indices to a single dimension index.

In block 230, the EDA system compares the index (e.g., TotalIndex) with the read access counter value. In the particular example implementation of FIG. 1, the read access counter value is incremented subsequent to the read operation. Accordingly, for purposes of comparison with the index, the read access counter value+1 is compared with the index. Recalling that the read access counter is initialized to −1, for the first read operation of the array in which element 0 is accessed, the read access counter value+1 (e.g., 0) is compared with the index.

In block 232, the EDA system determines whether a match has been determined. That is, the EDA system determines whether the index matches, or is equal to, the read access counter value+1. Lines 123-129 of FIG. 1C illustrate the comparison that is performed with line 126, in particular, specifying the condition to be met. In response to determining that a match has been detected, method 200 continues to block 236. In block 236, the EDA system performs the read operation and increments the read access counter value. Block 236 corresponds to lines 131-132 of FIG. 1C. In detecting a match in block 232, the EDA system determines that the array access for the current element is sequential. The value of the current access also may be output.

In response to detecting a mismatch in block 232, the EDA system generates an error and discontinues simulation of the application for HLS. For example, an error may be output in line 127 of FIG. 1C.

Continuing with block 238, the EDA system determines whether the application has completed reading elements of the array. In response to determining that the application has completed reading elements of the array, method 200 continues to block 226. In response to determining that the application has not completed reading elements of the array, method 200 loops back to block 210 to read further elements of the array.

In the example of FIG. 2, various operations such as detecting the accesses, determining whether each of the accesses occurs in sequential order, and generating an indication may be performed by the library code that is invoked responsive to each read access to an element of the array and responsive to each write access to an element of the array.

In the example of FIGS. 2 and 3, the application for HLS utilized a two-dimensional array. It should be appreciated that the array may have more than two dimensions. In such cases, the library code iterates between the program code starting at line 102 of FIG. 1C and the program code starting at line 78 of FIG. 1B. For example, the first bracket operator returns the element object Ele. For each other bracket operator (where each bracket operator corresponds to a dimension index of the array), the library code executes the program code starting at line 102 and the program code starting at line 78. This program code is executed in an iterative manner for each bracket operator after the first to generate the index or subscript of the particular element of the array being accessed.

FIG. 4 illustrates example output generated through simulation of the example application of FIG. 3 using the example library code of FIG. 1. In the example, the write accesses and the read accesses are tracked for a 12-element array and are determined to be sequential. In this example, the access increase sequentially. FIG. 4 illustrates an example in which the array accesses conform to the requirements for implementation of an array as a stream channel in a hardware implementation of the application.

FIG. 5 illustrates example output generated through simulation of a modified version of the example application of FIG. 3 using the example library code of FIG. 1. In the example, the instruction at line 32 of FIG. 3 is no longer remarked out causing a non-sequential write (e.g., a non-sequential access) violation to be detected. A notification is provided thereby allowing debugging and/or correction of the application prior to generation of an RTL description. As noted, a sequential access violation as detected by the example library code prevents the generation of a functional hardware implementation in which the array is implemented as a stream channel. The access violation is detected earlier in the development process prior to conversion of the application into an RTL description.

Figure 6:
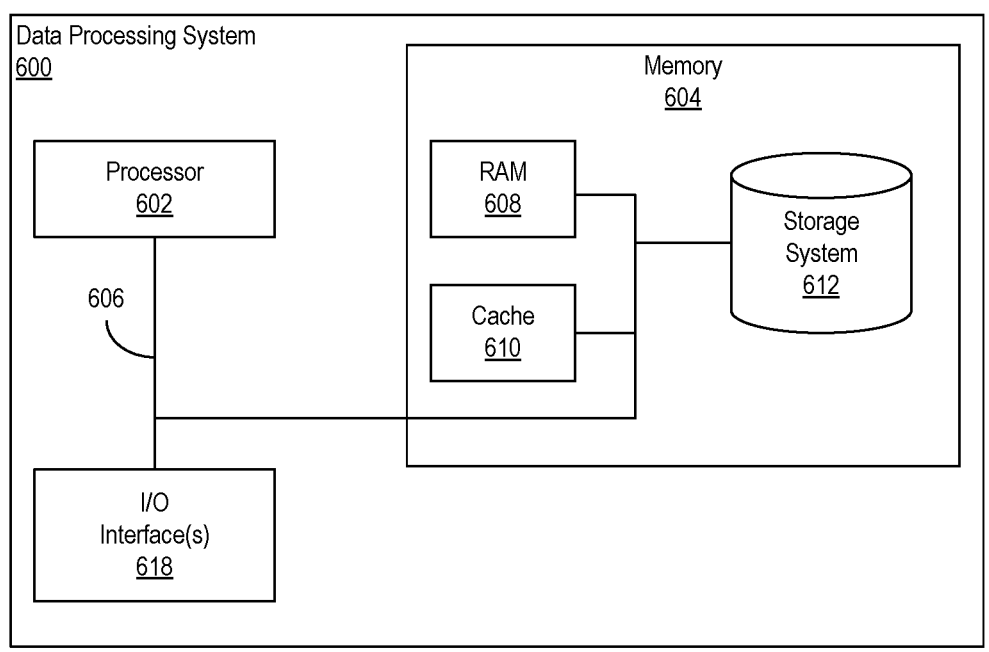
FIG. 6 illustrates an example implementation of a data processing system.

FIG. 6 illustrates an example implementation of a data processing system 600. As defined herein, the term "data processing system" means one or more hardware systems configured to process data, each hardware system including at least one processor and memory, wherein the processor is programmed with computer-readable instructions that, upon execution, initiate operations. Data processing system 600 can include a processor 602, a memory 604, and a bus 606 that couples various system components including memory 604 to processor 602.

Processor 602 may be implemented as one or more processors. In an example, processor 602 is implemented as a central processing unit (CPU). Processor 602 may be implemented as one or more circuits (e.g., as hardware) capable of carrying out instructions contained in program code. The circuit may be an integrated circuit or embedded in an integrated circuit. Processor 602 may be implemented using a complex instruction set computer architecture (CISC), a reduced instruction set computer architecture (RISC), a vector processing architecture, or other known architectures. Example processors include, but are not limited to, processors having an x86 type of architecture (IA-32, IA-64, etc.), Power Architecture, ARM processors, and the like.

Bus 606 represents one or more of any of a variety of communication bus structures. By way of example, and not limitation, bus 606 may be implemented as a Peripheral Component Interconnect Express (PCIe) bus. Data processing system 600 typically includes a variety of computer system readable media. Such media may include computer-readable volatile and non-volatile media and computer-readable removable and non-removable media.

Memory 604 can include computer-readable media in the form of volatile memory, such as random-access memory (RAM) 608 and/or cache memory 610. Data processing system 600 also can include other removable/non-removable, volatile/non-volatile computer storage media. By way of example, storage system 612 can be provided for reading from and writing to a non-removable, non-volatile magnetic and/or solid-state media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 606 by one or more data media interfaces. Memory 604 is an example of at least one computer program product.

Memory 604 is capable of storing computer-readable program instructions that are executable by processor 602. For example, the computer-readable program instructions can include an operating system, one or more application programs, other program code, and program data. For example, the computer-readable program instructions may implement an EDA system that is capable of performing the operations described herein in connection with FIGS. 1-5. Processor 602, in executing the computer-readable program instructions, is capable of performing the various operations described herein that are attributable to a computer. It should be appreciated that data items used, generated, and/or operated upon by data processing system 600 are functional data structures that impart functionality when employed by data processing system 600. As defined within this disclosure, the term "data structure" means a physical implementation of a data model's organization of data within a physical memory. As such, a data structure is formed of specific electrical or magnetic structural elements in a memory. A data structure imposes physical organization on the data stored in the memory as used by an application program executed using a processor.

Data processing system 600 may include one or more Input/Output (I/O) interfaces 618 communicatively linked to bus 606. I/O interface(s) 618 allow data processing system 600 to communicate with one or more external devices and/or communicate over one or more networks such as a local area network (LAN), a wide area network (WAN), and/or a public network (e.g., the Internet). Examples of I/O interfaces 618 may include, but are not limited to, network cards, modems, network adapters, hardware controllers, etc. Examples of external devices also may include devices that allow a user to interact with data processing system 600 (e.g., a display, a keyboard, and/or a pointing device) and/or other devices such as accelerator card.

Data processing system 600 is only one example implementation. Data processing system 600 can be practiced as a standalone device (e.g., as a user computing device or a server, as a bare metal server), in a cluster (e.g., two or more interconnected computers), or in a distributed cloud computing environment (e.g., as a cloud computing node) where tasks are performed by remote processing devices that are linked through a communications network. In a distributed cloud computing environment, program modules may be located in both local and remote computer system storage media including memory storage devices.

The example of FIG. 6 is not intended to suggest any limitation as to the scope of use or functionality of example implementations described herein. Data processing system 600 is an example of computer hardware that is capable of performing the various operations described within this disclosure. In this regard, data processing system 600 may include fewer components than shown or additional components not illustrated in FIG. 6 depending upon the particular type of device and/or system that is implemented. The particular operating system and/or application(s) included may vary according to device and/or system type as may the types of I/O devices included. Further, one or more of the illustrative components may be incorporated into, or otherwise form a portion of, another component. For example, a processor may include at least some memory.

An EDA system, as described herein, also may be configured to perform additional operations. The additional operations may be those included as part of a design flow. The operations may include synthesis, placement, and routing. The EDA system, in performing the design flow, may operate on an RTL description generated via HLS from an application. The EDA system is capable of generating a circuit design that may be implemented within target hardware such as an IC, whether a programmable IC or an Application Specific IC. In some cases, the circuit design may be specified as configuration data (e.g., a bitstream) that may be loaded into a programmable IC to implement the electronic system specified initially by the application for HLS.

By utilizing the library code as described herein during high-level simulation of the application, coding errors in the form of sequential access violations may be detected and corrected. Accordingly, as the application subsequently undergoes RTL simulation and processing through a design flow, the stream channels will be implemented correctly (whether in RTL or circuitry) and operate as intended.

While the disclosure concludes with claims defining novel features, it is believed that the various features described within this disclosure will be better understood from a consideration of the description in conjunction with the drawings. The process(es), machine(s), manufacture(s) and any variations thereof described herein are provided for purposes of illustration. Specific structural and functional details described within this disclosure are not to be interpreted as limiting, but merely as a basis for the claims and as a representative basis for teaching one skilled in the art to variously employ the features described in virtually any appropriately detailed structure. Further, the terms and phrases used within this disclosure are not intended to be limiting, but rather to provide an understandable description of the features described.

For purposes of simplicity and clarity of illustration, elements shown in the figures have not necessarily been drawn to scale. For example, the dimensions of some of the elements may be exaggerated relative to other elements for clarity. Further, where considered appropriate, reference numbers are repeated among the figures to indicate corresponding, analogous, or like features.

As defined herein, the singular forms "a," "an," and "the" are intended to include the plural forms as well, unless the context clearly indicates otherwise.

As defined herein, the term "approximately" means nearly correct or exact, close in value or amount but not precise. For example, the term "approximately" may mean that the recited characteristic, parameter, or value is within a predetermined amount of the exact characteristic, parameter, or value.

As defined herein, the terms "at least one," "one or more," and "and/or," are open-ended expressions that are both conjunctive and disjunctive in operation unless explicitly stated otherwise. For example, each of the expressions "at least one of A, B, and C," "at least one of A, B, or C," "one or more of A, B, and C," "one or more of A, B, or C," and "A, B, and/or C" means A alone, B alone, C alone, A and B together, A and C together, B and C together, or A, B and C together.

As defined herein, the term "automatically" means without human intervention. As defined herein, the term "user" means a human being.

As defined herein, the term "computer-readable storage medium" means a storage medium that contains or stores program instructions for use by or in connection with an instruction execution system, apparatus, or device. As defined herein, a "computer-readable storage medium" is not a transitory, propagating signal per se. The various forms of memory, as described herein, are examples of computer-readable storage media. A non-exhaustive list of examples of computer-readable storage media include an electronic storage device, a magnetic storage device, an optical storage device, an electromagnetic storage device, a semiconductor storage device, or any suitable combination of the foregoing. A non-exhaustive list of more specific examples of a computer-readable storage medium may include: a portable computer diskette, a hard disk, a RAM, a read-only memory (ROM), an erasable programmable read-only memory (EPROM or Flash memory), an electronically erasable programmable read-only memory (EEPROM), a static random-access memory (SRAM), a portable compact disc read-only memory (CD-ROM), a digital versatile disk (DVD), a memory stick, a floppy disk, or the like.

As defined herein, the term "if" means "when" or "upon" or "in response to" or "responsive to," depending upon the context. Thus, the phrase "if it is determined" or "if [a stated condition or event] is detected" may be construed to mean "upon determining" or "in response to determining" or "upon detecting [the stated condition or event]" or "in response to detecting [the stated condition or event]" or "responsive to detecting [the stated condition or event]" depending on the context.

As defined herein, the term "responsive to" and similar language as described above, e.g., "if," "when," or "upon," means responding or reacting readily to an action or event. The response or reaction is performed automatically. Thus, if a second action is performed "responsive to" a first action, there is a causal relationship between an occurrence of the first action and an occurrence of the second action. The term "responsive to" indicates the causal relationship.

As defined herein, the term "soft" in reference to a circuit means that the circuit is implemented in programmable logic or programmable circuitry. Thus, a "soft processor" means at least one circuit implemented in programmable circuitry that is capable of carrying out instructions embodied as program instructions.

As defined herein, the term "output" means storing in physical memory elements, e.g., devices, writing to display or other peripheral output device, sending or transmitting to another system, exporting, or the like.

As defined herein, the term "real-time" means a level of processing responsiveness that a user or system senses as sufficiently immediate for a particular process or determination to be made, or that enables the processor to keep up with some external process.

As defined herein, the term "substantially" means that the recited characteristic, parameter, or value need not be achieved exactly, but that deviations or variations, including for example, tolerances, measurement error, measurement accuracy limitations, and other factors known to those of skill in the art, may occur in amounts that do not preclude the effect the characteristic was intended to provide.

The terms first, second, etc. may be used herein to describe various elements. These elements should not be limited by these terms, as these terms are only used to distinguish one element from another unless stated otherwise or the context clearly indicates otherwise.

A computer program product may include a computer-readable storage medium (or media) having computer-readable program instructions thereon for causing a processor to carry out aspects of the inventive arrangements described herein. Within this disclosure, the term "program code" is used interchangeably with the term "program instructions." Computer-readable program instructions described herein may be downloaded to respective computing/processing devices from a computer-readable storage medium or to an external computer or external storage device via a network, for example, the Internet, a LAN, a WAN and/or a wireless network. The network may include copper transmission cables, optical transmission fibers, wireless transmission, routers, firewalls, switches, gateway computers and/or edge devices including edge servers. A network adapter card or network interface in each computing/processing device receives computer-readable program instructions from the network and forwards the computer-readable program instructions for storage in a computer-readable storage medium within the respective computing/processing device.

Computer-readable program instructions for carrying out operations for the inventive arrangements described herein may be assembler instructions, instruction-set-architecture (ISA) instructions, machine instructions, machine dependent instructions, microcode, firmware instructions, or either source code or object code written in any combination of one or more programming languages, including an object-oriented programming language and/or procedural programming languages. Computer-readable program instructions may include state-setting data. The computer-readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a LAN or a WAN, or the connection may be made to an external computer (for example, through the Internet using an Internet Service Provider). In some cases, electronic circuitry including, for example, programmable logic circuitry, an FPGA, or a PLA may execute the computer-readable program instructions by utilizing state information of the computer-readable program instructions to personalize the electronic circuitry, in order to perform aspects of the inventive arrangements described herein.

Certain aspects of the inventive arrangements are described herein with reference to flowchart illustrations and/or block diagrams of methods, apparatus (systems), and computer program products. It will be understood that each block of the flowchart illustrations and/or block diagrams, and combinations of blocks in the flowchart illustrations and/or block diagrams, may be implemented by computer-readable program instructions, e.g., program code.

These computer-readable program instructions may be provided to a processor of a computer, special-purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer-readable program instructions may also be stored in a computer-readable storage medium that can direct a computer, a programmable data processing apparatus, and/or other devices to function in a particular manner, such that the computer-readable storage medium having instructions stored therein comprises an article of manufacture including instructions which implement aspects of the operations specified in the flowchart and/or block diagram block or blocks.

The computer-readable program instructions may also be loaded onto a computer, other programmable data processing apparatus, or other device to cause a series of operations to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various aspects of the inventive arrangements. In this regard, each block in the flowchart or block diagrams may represent a module, segment, or portion of instructions, which comprises one or more executable instructions for implementing the specified operations.

In some alternative implementations, the operations noted in the blocks may occur out of the order noted in the figures. For example, two blocks shown in succession may be executed substantially concurrently, or the blocks may sometimes be executed in the reverse order, depending upon the functionality involved. In other examples, blocks may be performed generally in increasing numeric order while in still other examples, one or more blocks may be performed in varying order with the results being stored and utilized in subsequent or other blocks that do not immediately follow. It will also be noted that each block of the block diagrams and/or flowchart illustration, and combinations of blocks in the block diagrams and/or flowchart illustration, may be implemented by special purpose hardware-based systems that perform the specified functions or acts or carry out combinations of special purpose hardware and computer instructions.

What is claimed is:

1. A method, comprising:
  performing a simulation, using computer hardware, of an application for High-Level Synthesis (HLS);
  during the simulation, detecting accesses of the application to elements of an array of the application;
  during the simulation, determining whether the accesses occur in sequential order; and
  generating an indication of whether the accesses occur in sequential order;
  wherein the array signifies a stream channel of a hardware implementation of the application.

2. The method of claim 1, wherein the detecting the accesses and the determining whether the accesses occur in sequential order are performed for write accesses to the array and for read accesses to the array.

3. The method of claim 2, wherein the detecting the accesses, the determining whether the accesses occur in sequential order, and the generating the indication are performed by a library invoked responsive to each read access to an element of the array and responsive to each write access to an element of the array.

4. The method of claim 2, further comprising, during the simulation:
  maintaining a write access counter that is incremented in response to each write access to an element of the array that is detected;
  comparing the write access counter with an index of the element of the array being written; and
  detecting whether each write access is sequential based on the comparing.

5. The method of claim 4, further comprising:
  determining the index of the element of the array being written based on a current state of each dimension of the array.

6. The method of claim 2, further comprising, during the simulation:
  maintaining a read access counter that is incremented in response to each read access to an element of the array that is detected;
  comparing the read access counter with an index of the element of the array being read; and
  detecting whether each read access is sequential based on the comparing.

7. The method of claim 6, further comprising:
  determining the index of the element of the array being read based on a current state of each dimension of the array.

8. A system, comprising:
  one or more processors configured to initiate operations including:
    performing a simulation of an application for High-Level Synthesis (HLS);
    during the simulation, detecting accesses of the application to elements of an array of the application;
    during the simulation, determining whether the accesses occur in sequential order; and
    generating an indication of whether the accesses occur in sequential order;
    wherein the array signifies a stream channel of a hardware implementation of the application.

9. The system of claim 8, wherein the detecting the accesses and the determining whether the accesses occur in sequential order are performed for write accesses to the array and for read accesses to the array.

10. The system of claim 9, wherein the detecting the accesses, the determining whether the accesses occur in sequential order, and the generating the indication are performed by a library invoked responsive to each read access to an element of the array and responsive to each write access to an element of the array.

11. The system of claim 9, wherein the one or more processors are configured to initiate operations during the simulation further comprising:
  maintaining a write access counter that is incremented in response to each write access to an element of the array that is detected;

comparing the write access counter with an index of the element of the array being written; and detecting whether each write access is sequential based on the comparing.

12. The system of claim 11, wherein the one or more processors are configured to initiate operations further comprising:

determining the index of the element of the array being written based on a current state of each dimension of the array.

13. The system of claim 9, wherein the one or more processors are configured to initiate operations during the simulation further comprising:

maintaining a read access counter that is incremented in response to each read access to an element of the array that is detected;

comparing the read access counter with an index of the element of the array being read; and detecting whether each read access is sequential based on the comparing.

14. The system of claim 13, wherein the one or more processors are configured to initiate operations further comprising:

determining the index of the element of the array being read based on a current state of each dimension of the array.

15. A method, comprising:

performing a simulation, using computer hardware, of an application for High-Level Synthesis (HLS);

during the simulation, detecting accesses of the application to elements of an array of the application;

during the simulation, determining whether the accesses occur in sequential order; and generating an indication of whether the accesses occur in sequential order;

wherein the detecting the accesses and the determining whether the accesses occur in sequential order are performed for write accesses to the array and for read accesses to the array; and wherein the detecting the accesses, the determining whether the accesses occur in sequential order, and the generating the indication are performed by a library invoked responsive to each read access to an element of the array and responsive to each write access to an element of the array.

16. The method of claim 15, further comprising, during the simulation:

maintaining a write access counter that is incremented in response to each write access to an element of the array that is detected;

comparing the write access counter with an index of the element of the array being written; and detecting whether each write access is sequential based on the comparing.

17. The method of claim 15, further comprising, during the simulation:

maintaining a read access counter that is incremented in response to each read access to an element of the array that is detected;

comparing the read access counter with an index of the element of the array being read; and detecting whether each read access is sequential based on the comparing.

18. The method of claim 15, wherein the array signifies a stream channel of a hardware implementation of the application.

* * * * *